(12) United States Patent
Leobandung et al.

(10) Patent No.: US 10,347,739 B2
(45) Date of Patent: Jul. 9, 2019

(54) EXTENDED CONTACT AREA USING UNDERCUT SILICIDE EXTENSIONS

(71) Applicant: INTERNATIONAL BUSINESS MACHINES CORPORATION, Armonk, NY (US)

(72) Inventors: Effendi Leobandung, Stormville, NY (US); Soon-Cheon Seo, Glenmont, NY (US); Tenko Yamashita, Schenectady, NY (US); Chun-Chen Yeh, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/618,227

(22) Filed: Jun. 9, 2017

(65) Prior Publication Data
US 2017/0278942 A1 Sep. 28, 2017

Related U.S. Application Data

(62) Division of application No. 14/449,194, filed on Aug. 1, 2014, now Pat. No. 9,716,160.

(51) Int. Cl.
*H01L 29/78* (2006.01)
*H01L 29/417* (2006.01)
(Continued)

(52) U.S. Cl.
CPC ...... *H01L 29/665* (2013.01); *H01L 21/28518* (2013.01); *H01L 21/76816* (2013.01);
(Continued)

(58) Field of Classification Search
CPC ......... H01L 21/28518; H01L 21/31111; H01L 21/31116; H01L 21/76816;
(Continued)

(56) References Cited

U.S. PATENT DOCUMENTS 5,166,096 A 11/1992 Cote et al.
5,405,806 A 4/1995 Pfiester et al.
(Continued)

FOREIGN PATENT DOCUMENTS

JP 2000164866 A 6/2000

OTHER PUBLICATIONS

IBM: List of IBM Patents or Patent Applications Treated as Related (Apendix P), Jun. 29, 2017, 2 pages.
(Continued)

*Primary Examiner* — Mary A Wilczewski
(74) *Attorney, Agent, or Firm* — L. Jeffrey Kelly

(57) ABSTRACT

The present invention relates generally to semiconductor devices and more particularly, to a structure and method of forming a contact silicide on a source-drain (S-D) region of a field effect transistor (FET) having extensions by using an undercut etch and a salicide process. A method of forming a contact silicide extension is disclosed. The method may include: forming an undercut region below a dielectric layer and above a source-drain region, the undercut region located directly below a bottom of a contact trench and extending below the dielectric layer to a gate spacer formed on a sidewall of a gate stack; and forming a contact silicide in the undercut region, the contact silicide in direct contact with the source-drain region.

16 Claims, 14 Drawing Sheets

(51) Int. Cl.
*H01L 21/285* (2006.01)
*H01L 21/768* (2006.01)
*H01L 29/66* (2006.01)
*H01L 21/311* (2006.01)
*H01L 21/8234* (2006.01)
*H01L 21/8238* (2006.01)

(52) U.S. Cl.
CPC .. *H01L 21/76897* (2013.01); *H01L 29/41783* (2013.01); *H01L 29/66545* (2013.01); *H01L 29/66628* (2013.01); *H01L 21/31111* (2013.01); *H01L 21/31116* (2013.01); *H01L 21/76843* (2013.01); *H01L 21/76855* (2013.01); *H01L 21/823418* (2013.01); *H01L 21/823814* (2013.01)

(58) Field of Classification Search
CPC ......... H01L 21/76843; H01L 21/76855; H01L 21/76897; H01L 21/823418; H01L 21/823814; H01L 29/41783; H01L 29/665; H01L 29/66545; H01L 29/66628
See application file for complete search history.

(56) References Cited

U.S. PATENT DOCUMENTS

| | | | |
|---|---|---|---|
| 5,710,450 A * | 1/1998 | Chau | H01L 21/2254 257/344 |
| 5,864,161 A | 1/1999 | Mitani et al. | |
| 5,989,965 A | 11/1999 | Maa et al. | |
| 6,150,260 A | 11/2000 | Roy | |
| 6,265,272 B1 | 7/2001 | Chen | |
| 6,297,109 B1 | 10/2001 | Chan et al. | |
| 6,316,803 B1 | 11/2001 | Ban et al. | |
| 6,566,208 B2 * | 5/2003 | Pan | H01L 21/2257 257/E21.151 |
| 6,617,209 B1 | 9/2003 | Chau et al. | |
| 6,627,502 B1 * | 9/2003 | Cho | H01L 21/2257 257/E21.151 |
| 6,800,530 B2 | 10/2004 | Lee et al. | |
| 6,930,030 B2 | 8/2005 | Rausch et al. | |
| 6,991,979 B2 | 1/2006 | Ajmera et al. | |
| 7,067,855 B2 * | 6/2006 | Cardone | H01L 21/02381 257/19 |
| 7,105,390 B2 | 9/2006 | Brask et al. | |
| 7,176,110 B2 | 2/2007 | van Bentum et al. | |
| 7,208,803 B2 | 4/2007 | Ting | |
| 7,358,551 B2 * | 4/2008 | Chidambarrao | H01L 21/823412 257/288 |
| 7,390,707 B2 * | 6/2008 | Kawamura | H01L 21/26506 257/E21.165 |
| 7,396,767 B2 | 7/2008 | Wu et al. | |
| 7,638,402 B2 | 12/2009 | Nandakumar et al. | |
| 8,361,859 B2 | 1/2013 | Adam et al. | |
| 8,440,533 B2 | 5/2013 | Toh et al. | |
| 8,466,502 B2 | 6/2013 | Tsai et al. | |
| 8,513,765 B2 | 8/2013 | Cheng et al. | |
| 8,546,228 B2 * | 10/2013 | Doris | H01L 21/84 257/E21.619 |
| 8,592,916 B2 | 11/2013 | Khakihrooz et al. | |
| 8,664,104 B2 | 3/2014 | Nemouchi et al. | |
| 8,722,523 B2 | 5/2014 | Schloesser et al. | |
| 8,916,479 B1 | 12/2014 | Nowling | |
| 9,111,906 B2 * | 8/2015 | Lin | H01L 21/82341 |
| 9,136,348 B2 | 9/2015 | Wei et al. | |
| 9,147,748 B1 * | 9/2015 | Xie | H01L 29/66545 |
| 9,153,655 B2 * | 10/2015 | Lin | H01L 21/82341 |
| 9,466,722 B2 * | 10/2016 | Liu | H01L 21/82342 |
| 9,496,354 B2 * | 11/2016 | Xie | H01L 29/66545 |
| 9,577,096 B2 * | 2/2017 | Leobandung | H01L 23/535 |
| 9,716,160 B2 * | 7/2017 | Leobandung | H01L 29/665 |
| 9,870,943 B2 * | 1/2018 | Ko | H01L 29/0847 |
| 2004/0007724 A1 | 1/2004 | Murthy et al. | |
| 2004/0045499 A1 | 3/2004 | Langdo et al. | |
| 2004/0185640 A1 * | 9/2004 | Cardone | H01L 21/02381 438/478 |
| 2004/0256671 A1 | 12/2004 | Huang et al. | |
| 2005/0087824 A1 | 4/2005 | Cabral et al. | |
| 2005/0130454 A1 | 6/2005 | Murthy et al. | |
| 2005/0145956 A1 | 7/2005 | Wang et al. | |
| 2006/0040484 A1 | 2/2006 | Dokumaci et al. | |
| 2006/0131656 A1 * | 6/2006 | Shin | H01L 21/265 257/369 |
| 2006/0131665 A1 | 6/2006 | Murthy et al. | |
| 2007/0018205 A1 * | 1/2007 | Chidambarrao | H01L 21/82341 257/288 |
| 2007/0231983 A1 * | 10/2007 | Shifren | H01L 21/823807 438/197 |
| 2008/0009110 A1 * | 1/2008 | Chang | H01L 21/28061 438/197 |
| 2008/0277735 A1 * | 11/2008 | Ko | H01L 21/823807 257/369 |
| 2009/0085125 A1 * | 4/2009 | Kim | H01L 21/823807 257/369 |
| 2010/0330755 A1 * | 12/2010 | Hsiao | H01L 21/823807 438/218 |
| 2012/0193712 A1 | 8/2012 | Bryant et al. | |
| 2013/0161744 A1 | 6/2013 | Basker et al. | |
| 2013/0193446 A1 | 8/2013 | Chao et al. | |
| 2013/0193502 A1 | 8/2013 | Kocon et al. | |
| 2013/0214362 A1 | 8/2013 | Nemouchi et al. | |
| 2015/0206946 A1 | 7/2015 | Chen et al. | |
| 2016/0035857 A1 | 2/2016 | Leobandung et al. | |
| 2017/0278942 A1 * | 9/2017 | Leobandung | H01L 29/665 |

OTHER PUBLICATIONS

Lim et al., "Atomic layer deposition of transition metals", nature materials, vol. 2, Nov. 2003, www.nature.com/naturematerials, 2003 Nature Publishing Group, pp. 749-754.

Besser et al., "Ni—Pt silicide formation through Ti mediating layers" (abstract only), Microelectronic Engineering, vol. 84, Issue 11, Nov. 2007, pp. 2511-2516.

McDevitt et al., "Collimated Sputtering of Titanium Liner Films to Control Resistance of High Aspect-Ratio Contacts" (abstract only), Society of Photo-Optical Instrumentation Engineers (SPIE) Conference Series, vol. 1805, 1992, p. 89.

Dixit et al., "Ion Metal Plasma (IMP) Deposited Titanium Liners for 0.25/0.18 um Multilevel Interconnections," International Electron Devices Meeting (IEDM), 1996, pp. 357-360.

Solomon et al., "Two Gates Are Better Than One," IEEE Circuits and Devices Magazine, Jan. 2003, pp. 48-62.

* cited by examiner

US 10,347,739 B2

EXTENDED CONTACT AREA USING UNDERCUT SILICIDE EXTENSIONS

BACKGROUND

The present invention relates generally to semiconductor devices and more particularly, to a structure and method of forming a contact silicide in a field effect transistor (FET).

The electrical resistance between a metal contact and source-drain (S-D) region may be reduced by forming a metal silicide atop the S-D region prior to the formation of the metal contact. Typically, the metal silicide may be formed by a self-aligned silicide (salicide) process. In the salicide process, a thin layer of a metal, such as titanium or cobalt, is blanket deposited over a semiconductor substrate, specifically over portions of the S-D region exposed by a contact trench formed in a dielectric layer. The semiconductor substrate may then subjected to one or more annealing steps, which may cause the metal to selectively react with silicon in the exposed portions of the S-D regions to form a metal silicide. The process is referred to as the self-aligned silicide process because the silicide layer is formed only where the metal material directly contacts the exposed portions of the S-D regions.

SUMMARY

According to an embodiment, a method of forming a contact silicide is disclosed. The method may include: forming an undercut region below a dielectric layer and above a source-drain region, the undercut region located directly below a bottom of a contact trench and extending below the dielectric layer to a gate spacer formed on a sidewall of a gate stack; and forming a contact silicide in the undercut region, the contact silicide in direct contact with the source-drain region.

According to another embodiment, a method is disclosed. The method may include: forming a gate stack on a substrate; forming a gate spacer on a sidewall of the gate stack; forming a source-drain region adjacent to the gate spacer; forming a liner on the source-drain region; forming a dielectric layer over the liner; forming a contact trench in the dielectric layer, a bottom of the contact trench exposing a portion of the liner; removing a portion of the liner below the contact trench and below the dielectric layer to form an undercut region, the undercut region extending from below the bottom of the contact trench and below the dielectric layer to the gate spacer; and forming a contact silicide in the undercut region, the contact silicide in direct contact with the source-drain region.

According to another embodiment, a structure is disclosed. The structure may include: a gate stack on a substrate; a gate spacer adjacent to and contacting a sidewall of the gate stack; a source-drain region adjacent to the gate spacer; a liner layer on an upper portion of the gate spacer; a dielectric layer on the gate stack and the gate spacer and above the source-drain region, the dielectric layer having a bottom surface that is substantially flush with a bottom surface of the liner layer; an electrical contact formed in the dielectric layer; and a contact silicide directly on the source-drain region, the contact silicide directly below the contact, below the dielectric layer, and below the liner layer, and the contact silicide extending beyond a width of a bottom of the electrical contact.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
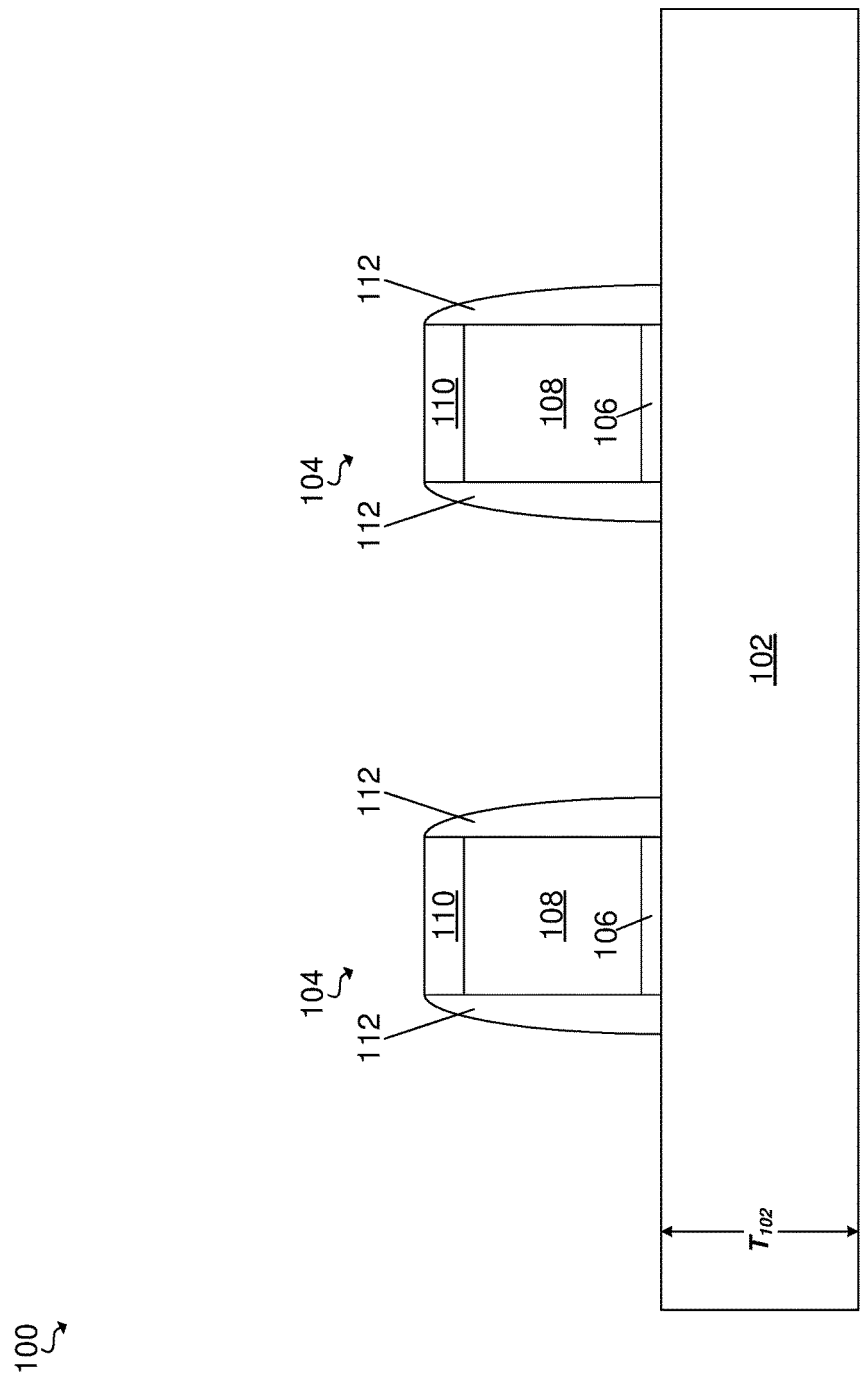
FIG. 1 is a cross section view illustrating a structure having dummy gate stacks, according to an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer, region, or substrate is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally to semiconductor devices and more particularly, to a structure and method of forming a contact silicide on a source-drain (S-D) region of a field effect transistor (FET) having extensions by using an undercut etch and a salicide process. As device size continues to scale down, the distance between adjacent gate stacks has become smaller. This in turn, may limit the available room available for a self-aligned contact landing to be formed on a S-D region. In some cases, the gate stacks may be so close to one another that a self-aligned contact may land partially over an individual gate stack, causing a much reduced contact area on the S-D region. In both instances, the resistance of the contact may be dramatically increased because of such a small area available at the bottom of the contact trench for the silicide to be formed through a conventional salicide process. Embodiments by which the contact area may be extended beyond the width of the self-aligned contact using an undercut etching process is described below with reference to FIGS. 1-14.

Referring now to FIG. 1, a cross section view of a structure 100 is shown. The structure may include one or more dummy gate stacks 104 (hereinafter "dummy gate stacks") formed on a semiconductor substrate 102. In an embodiment, the semiconductor substrate 102 may be composed of a bulk semiconductor material, such as, for example, crystalline silicon, e.g., monocrystalline silicon or polycrystalline silicon. In another embodiment, the semiconductor substrate 102 may be composed of any of the following: high-electron mobility semiconductor materials such as, for example, silicon germanium; III-V compound semiconductor materials, such as for example, gallium arsenide or indium phosphate; II-VI compound semiconductor materials, such as, for example, cadmium sellenide, or zinc oxide. In yet another embodiment, the semiconductor substrate 102 may be a silicon-on-insulator (SOI) substrate. Although, FIGS. 1-14 depict the structure 100 formed as a planar field effect transistor (FET), embodiments are contemplated in which the structure 100 may be a fin field effect transistor (finFET).

The semiconductor substrate 102 may have a thickness $T_{102}$ ranging from approximately 1 micron to approximately 1000 microns, although lesser and greater thicknesses may also be employed. The semiconductor substrate 102 may be doped with n-type dopants or p-type dopants. The dopant concentration of the semiconductor layer 104 may range from approximately $5.0E16$ atm/cm$^3$ to approximately $3.0E21$ atm/cm$^3$, although lesser and greater dopant concentrations can also be employed.

In an embodiment, the dummy gate stacks 104 may be formed by depositing a gate dielectric layer (not shown), a dummy gate layer (not shown), and a hardmask layer (not shown) on the semiconductor substrate 102 and then etching the layers to form a gate dielectric 106, a dummy gate 108, and a hardmask 110. In an embodiment, the gate dielectric 106 may be an oxide, nitride, or oxynitride of silicon. In another embodiment, the gate dielectric 106 may be composed of a high-k dielectric material. A high-k dielectric material has a dielectric constant higher than the dielectric constant of silicon dioxide (SiO2). In one embodiment, a high-k dielectric material has dielectric constant that is greater than 4.0. High-k dielectric materials suitable for the gate dielectric layer 106 may include, but are not limited to, hafnium oxides, hafnium silicates, titanium oxides, barium-strontium-titanates (BSTs), and lead-zirconate-titanates (PZTs). The gate dielectric 106 may be formed using a conventional deposition technique, such as, for example, chemical vapor deposition (CVD), plasma-enhanced CVD (PECVD), metal organic chemical vapor deposition (MOCVD), atomic layer deposition (ALD), molecular layer deposition (MLD), evaporation, reactive sputtering, chemical solution deposition, spin-on deposition, or other like processes.

The dummy gate 108 may be formed on the gate dielectric 106. The dummy gate 108 may be composed of a sacrificial material, such as, for example, polysilicon or amorphous silicon. The dummy gate 108 may be formed by a conventional deposition technique, such as those described above, as well as epitaxial growth. The hardmask 110 may be formed on the dummy gate 108. The hardmask 110 may be composed of an oxide, nitride, or an oxynitride. The hardmask 110 may be formed by a conventional deposition techniques, such as those described above.

In an embodiment, a pair of gate spacers 112 (hereinafter "gate spacers") may be formed on the semiconductor substrate 102 adjacent to and contacting sidewalls of the dummy gate stacks 104. The gate spacers 112 may be comprised of an insulator such as a nitride, oxide, oxynitride, and/or any combination thereof. In an embodiment, the gate spacers 112 may include an inner layer composed of an oxide and an outer layer composed of a nitride. The gate spacers 112 may be formed by a conventional deposition technique, such as those described above. After deposition, the gate spacers 112 may also undergo an etching process such as, but not limited to reactive ion etching (RIE).

Figure 2:
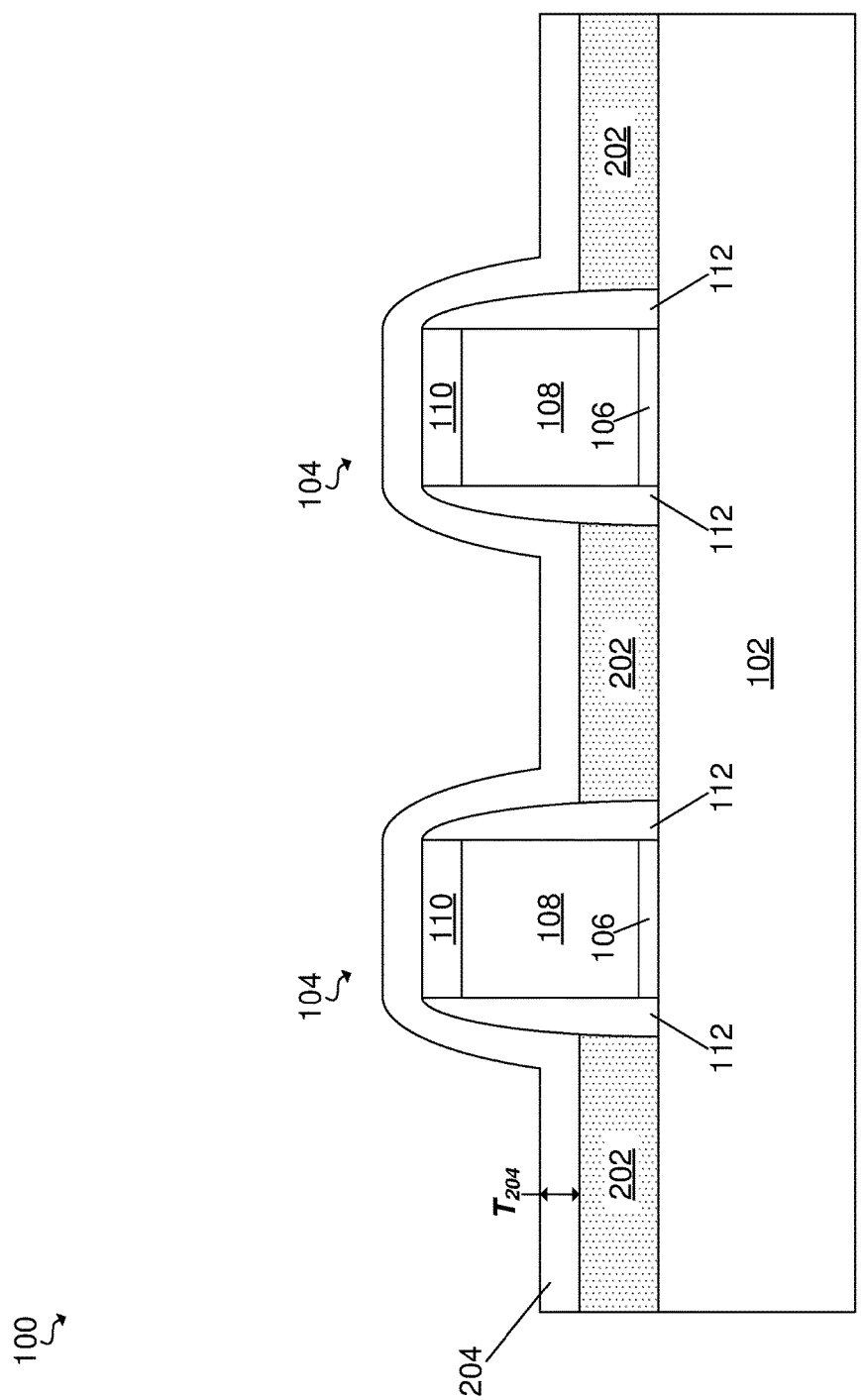
FIG. 2 is a cross section view illustrating forming source-drain regions and a liner layer on the structure, according to an embodiment of the present invention.

Referring now to FIG. 2, a cross section view illustrating forming one or more source-drain regions 202 (hereinafter "S-D regions") and a liner layer 204 on the structure 100 is shown. The S-D regions 202 may be formed between the dummy gate stacks 104 and may be adjacent to and contacting the gate spacers 112. The S-D regions 202 may be composed of a doped semiconductor material formed by an epitaxial growth and doping process.

In an embodiment, the S-D regions 202 may be raised source-drain regions, in which the doped semiconductor material is grown on an upper surface of the semiconductor substrate 102. In another embodiment, the S-D regions 202 may be formed by first forming a trench (not shown) in the semiconductor substrate 102 and then growing the doped semiconductor material in the trench. Examples of semiconductor materials that may be suitable the epitaxial growth of the S-D regions 202 may include, but are not limited to, silicon (single crystal, polysilicon, or amorphous), germanium (single crystal, polycrystalline, or amorphous), or a combination thereof.

After the semiconductor material is grown, it may be doped with dopant atoms using, for example, in-situ doping or ion implantation. In an embodiment, the semiconductor material may be doped with a p-type dopant such as, for example, boron, aluminum, gallium, indium, or alloys thereof. In another embodiment, the semiconductor material may be doped with a n-type dopant such as, for example, phosphorus, antimony, arsenic, or alloys thereof. After the doping process, the semiconductor material may have dopant a concentration ranging from approximately $1\times10^{19}$ atoms/cm$^3$ to approximately $5\times10^{21}$ atoms/cm$^3$.

After the semiconductor material has been doped, the structure 100 may be annealed to activate the dopant atoms and to complete the formation of the S-D regions 202. In an embodiment, the annealing process may include subjecting the structure 100 to an elevated temperature, ranging from approximately 800° C. to approximately 1250° C., for approximately 1 ms to approximately 500 ms. In another embodiment, the annealing process may be a rapid thermal anneal (RTA). In yet another embodiment, the annealing process may be a millisecond anneal such as a laser spike anneal or a flash lamp anneal.

Following the formation of the S-D regions 202, the liner layer 204 may be formed on the S-D regions 202, the gate spacers 112, and the hardmask 110. The liner layer 204 may be composed of a material that subsequently may be removed selective to the gate spacers 112. In an embodiment, the liner layer 204 may be composed of a metal nitride, such as, for example, titanium nitride. The liner layer 204 may have a thickness $T_{204}$ ranging from approximately 5 nm to approximately 20 nm. The liner layer 204 may be formed by a blanket deposition process, using a conventional deposition technique, such as, for example, CVD, PECVD, MOCVD, ALD, MLD, evaporation, reactive sputtering, chemical solution deposition, spin-on deposition, or other like processes.

Figure 3:
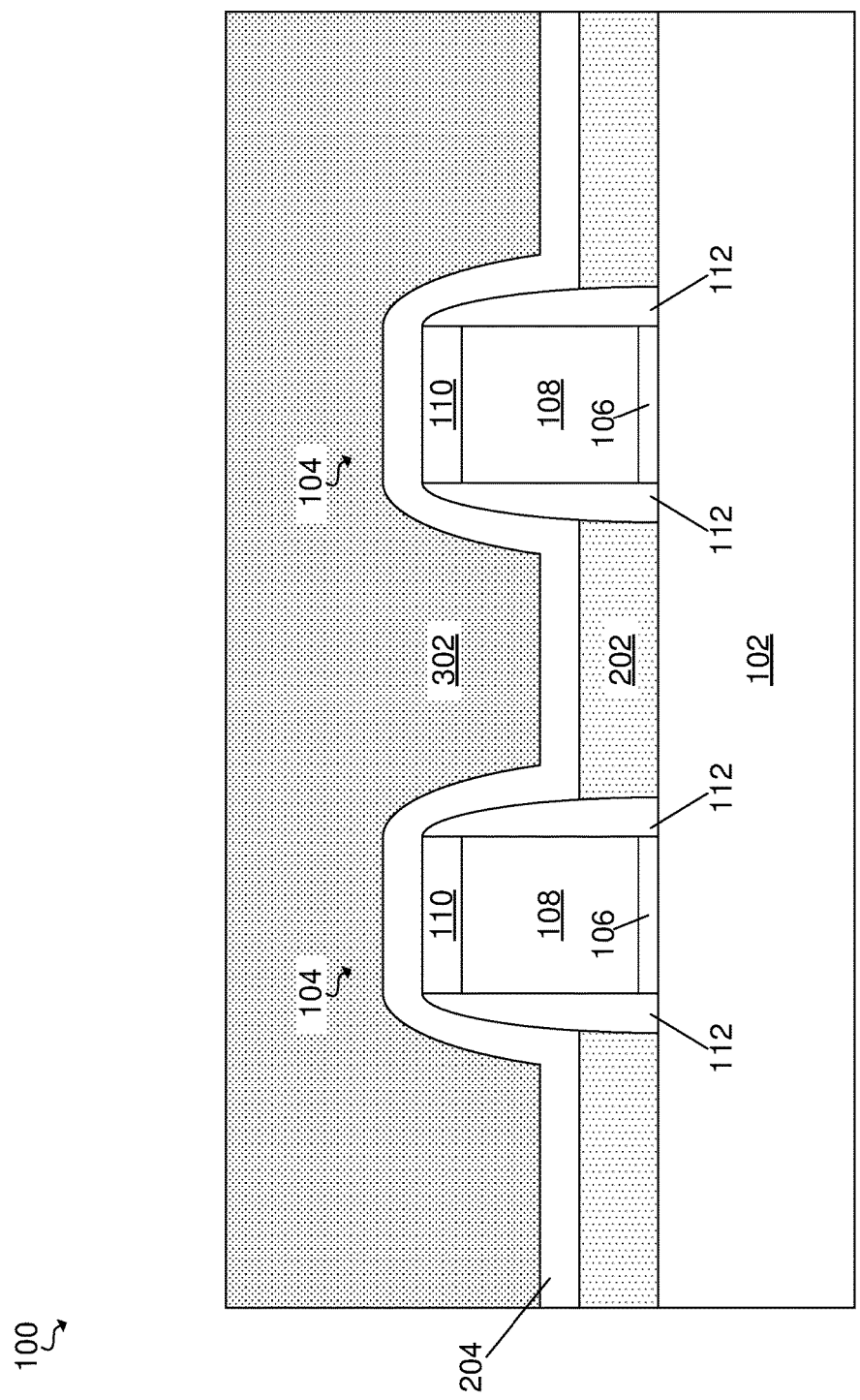
FIG. 3 is a cross section view illustrating forming a first dielectric layer on the liner layer, according to an embodiment of the present invention.

Referring now to FIG. 3, a cross section view illustrating forming the first dielectric layer 302 on the liner layer 204 is shown. The first dielectric layer 302 may be composed of a low-k dielectric material, such as, for example, an oxide, a nitride, or an oxynitride. In an embodiment, the first dielectric layer 302 may be composed of a flowable oxide. The first dielectric layer 302 may be formed using a conventional deposition technique, such as, for example, CVD, PECVD, MOCVD, ALD, MLD, evaporation, reactive sputtering, chemical solution deposition, spin-on deposition, or other like processes. In an embodiment, an upper surface of the first dielectric layer 302 may be above an upper surface of the gate stacks 104 and the liner layer 204 thereon.

Figure 4:
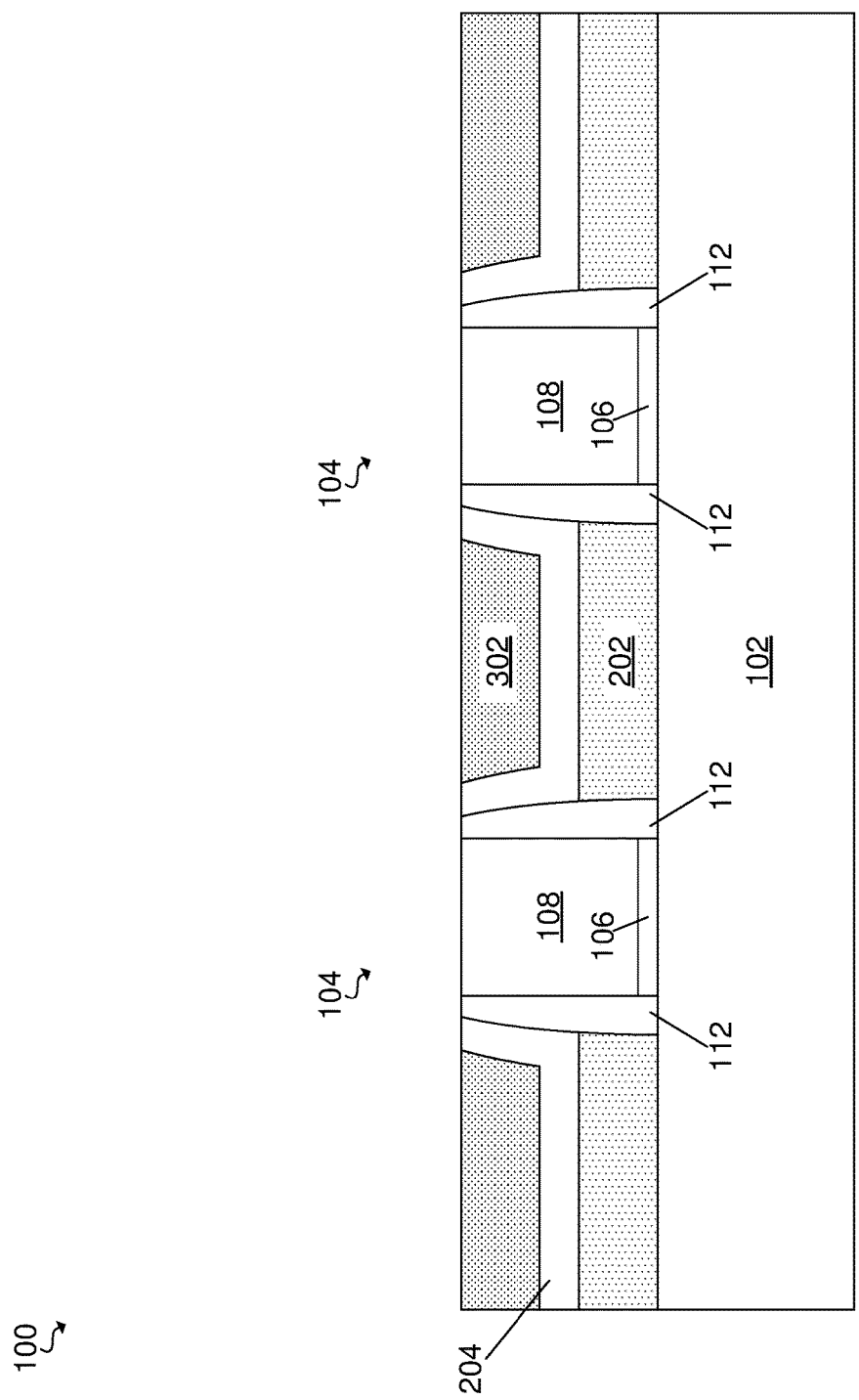
FIG. 4 is a cross section view illustrating removing a portion of the first dielectric layer and a portion of the gate stack, according to an embodiment of the present invention.

Referring now to FIG. 4, a cross section view illustrating removing a portion of the first dielectric layer 302 and a portion of the gate stack 104 is shown. The portion of the first dielectric layer 302 may be removed using a non-selective removal process, such as for example, chemical mechanical planarization (CMP). In an embodiment, the hardmask 110 (FIG. 3) may be removed along with the portion of the first dielectric layer 302 during the CMP process. In another embodiment, only a portion of the hardmask 110 may be removed. The remaining portion of the hardmask 100 may then be removed by an etching process that is selective to the liner layer 204, and the gate spacers 110, such as, for example, RIE. The removal of the portion of the first dielectric layer 302 and the hardmask 110 may expose the liner layer 204, the gate spacers 112, and the dummy gate 108.

Figure 5:
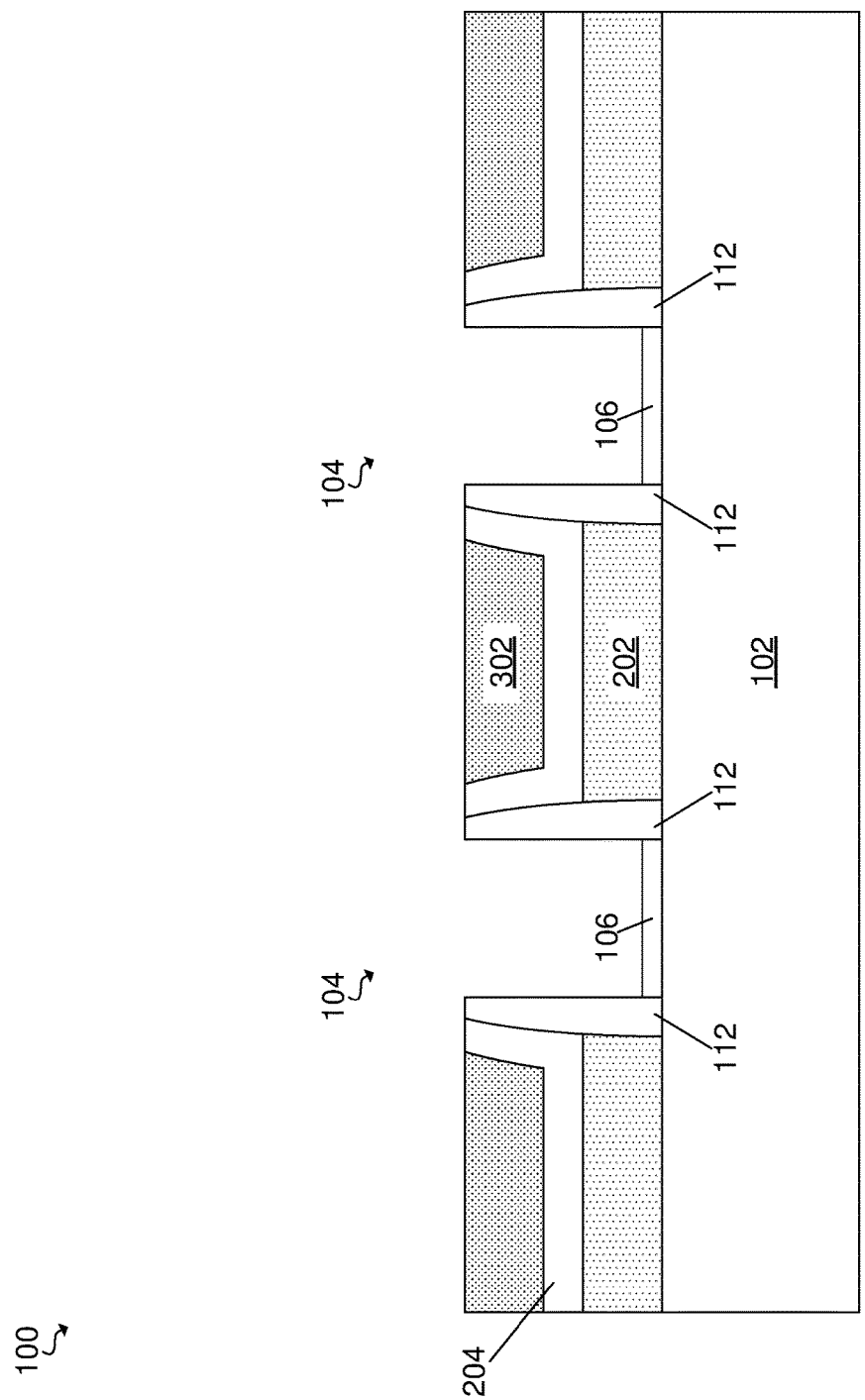
FIG. 5 is a cross section view illustrating removing a dummy gate, according to an embodiment of the present invention.

Referring now to FIG. 5, a cross section view illustrating removing the dummy gate 108 (FIG. 4) is shown. In an embodiment, the dummy gate 108 may be removed using an etching process that is selective to the first dielectric layer 302, the liner layer 204, the gate spacers 112, and the gate dielectric 106, such as, for example, RIE. In another embodiment, the gate dielectric 106 may also be removed and replaced later during subsequent processing steps.

Figure 6:
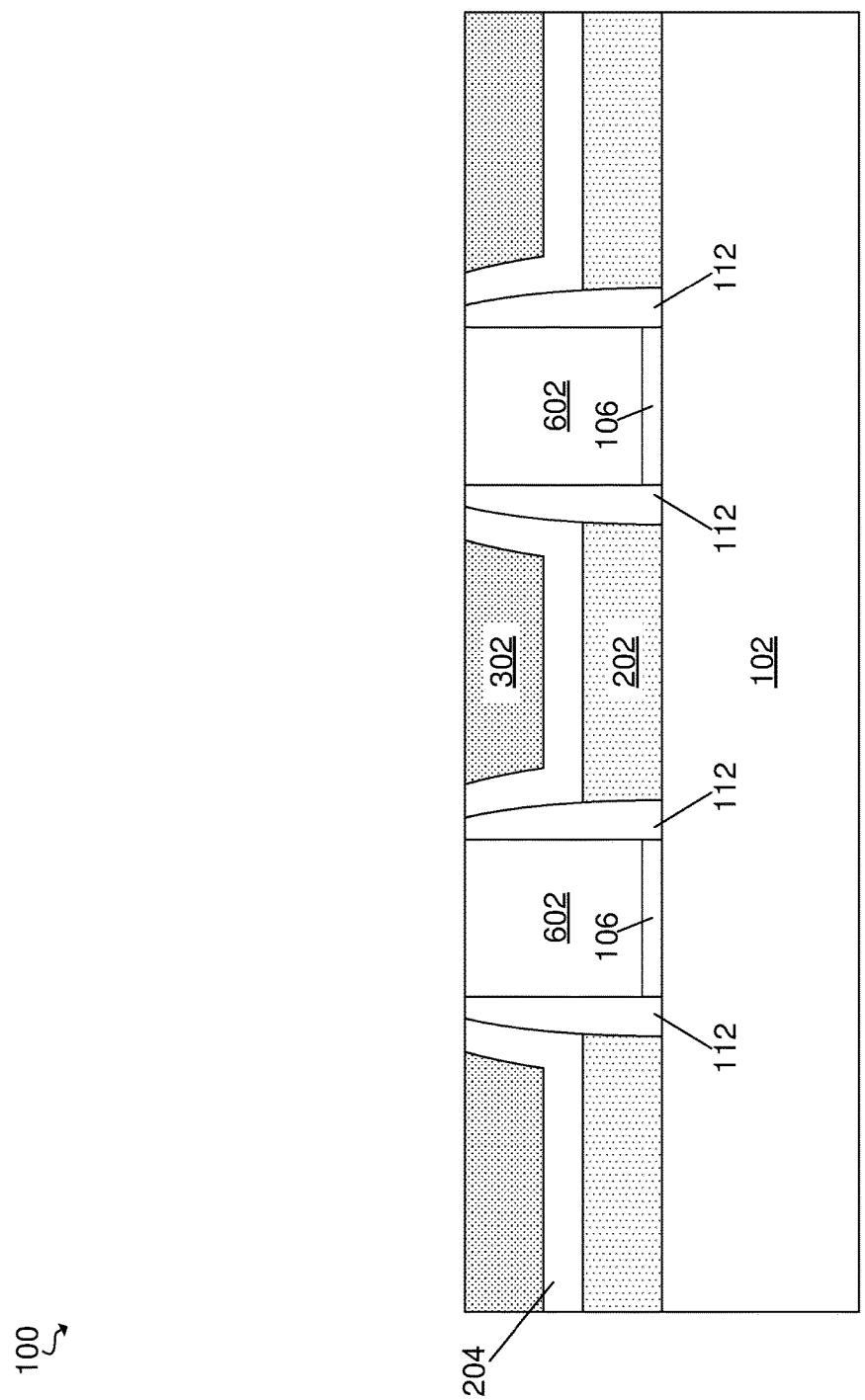
FIG. 6 is a cross section view illustrating forming a gate on a gate dielectric, according to an embodiment of the present invention.

Referring now to FIG. 6, a cross section view illustrating forming a gate 602 on the gate dielectric 106 is shown. In an embodiment, the gate 602 may be composed of one or more conductive materials including, but not limited to, metals, metal alloys, metal nitrides, metal silicides, as well as laminates thereof and composites thereof. In an embodiment, the gate 602 may be composed of one or more conductive metals, such as, for example: W, Ni, Ti, Mo, Ta, Cu, Pt, Ag, Au, Ru, Ir, Rh, Re, or alloys thereof. In another embodiment, the gate 602 may also be composed of doped polysilicon and/or polysilicon-germanium alloy materials having a dopant concentration ranging from approximately $1\times10^{18}$ dopant atoms/cm$^3$ to approximately $1\times10^{22}$ dopant atoms/cm$^3$. In yet another embodiment, the gate 602 may be composed of polycide materials of doped polysilicon/metal silicide materials. Although the gate 602 is depicted in FIG. 6 as being a single layer, embodiments are contemplated in which the gate 602 is multi-layered containing more than one conductive material. The gate 602 may be formed using a conventional deposition technique, such as, for example, CVD, PECVD, MOCVD, ALD, MLD, evaporation, reactive sputtering, chemical solution deposition, spin-on deposition, salicide, or other like processes. In an embodiment, the gate dielectric 106 may undergo a preclean process before the gate 602 is formed.

Figure 7:
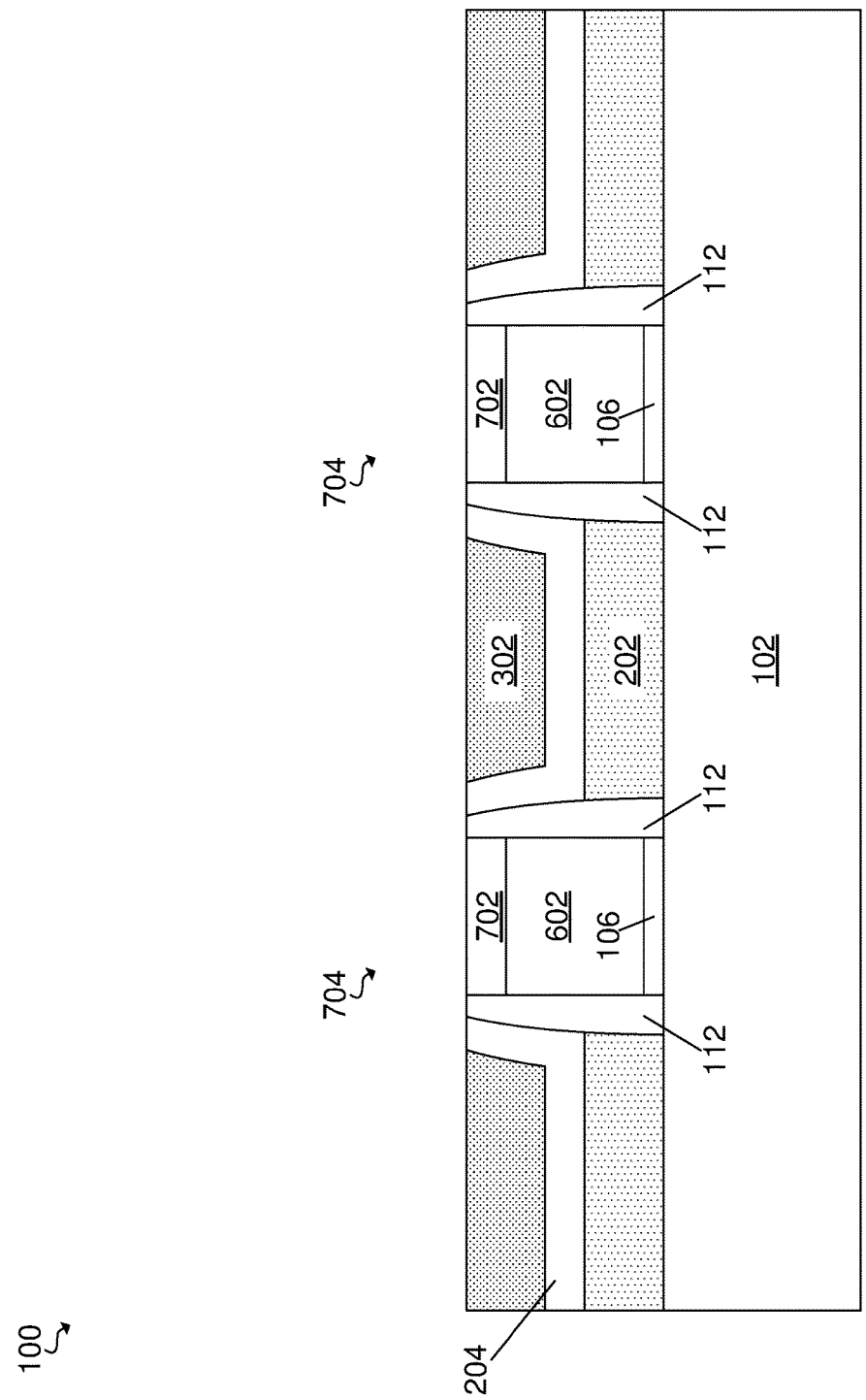
FIG. 7 is a cross section view illustrating forming a gate cap on the gate, according to an embodiment of the present invention.

Referring now to FIG. 7, a cross section view illustrating forming a gate cap 702 on the gate 602 to form a gate stack 704 is shown. The gate cap may be composed of dielectric material, such as, for example, an oxide, a nitride, or an oxynitride. In an embodiment, the gate cap 702 may be formed by first removing a portion of the gate 602 using an etching process that is selective to the gate spacers 112, the liner layer 204, and the first dielectric layer 302, such as, for example, RIE. After the portion of the gate 602 is removed, a gate cap layer (not shown) may be deposited over the first dielectric layer 302, the liner layer 204, and the gate spacers 112. The gate cap layer may be deposited using a conventional deposition process, such as, for example, CVD, PECVD, MOCVD, ALD, MLD, evaporation, reactive sputtering, chemical solution deposition, spin-on deposition, or other like processes. After the gate cap layer is formed, it may be planarized by, for example, CMP, such that the gate cap 702 remains. The gate gap 702 may have an upper surface that is substantially flush with an upper surface of the first dielectric layer 302.

Figure 8:
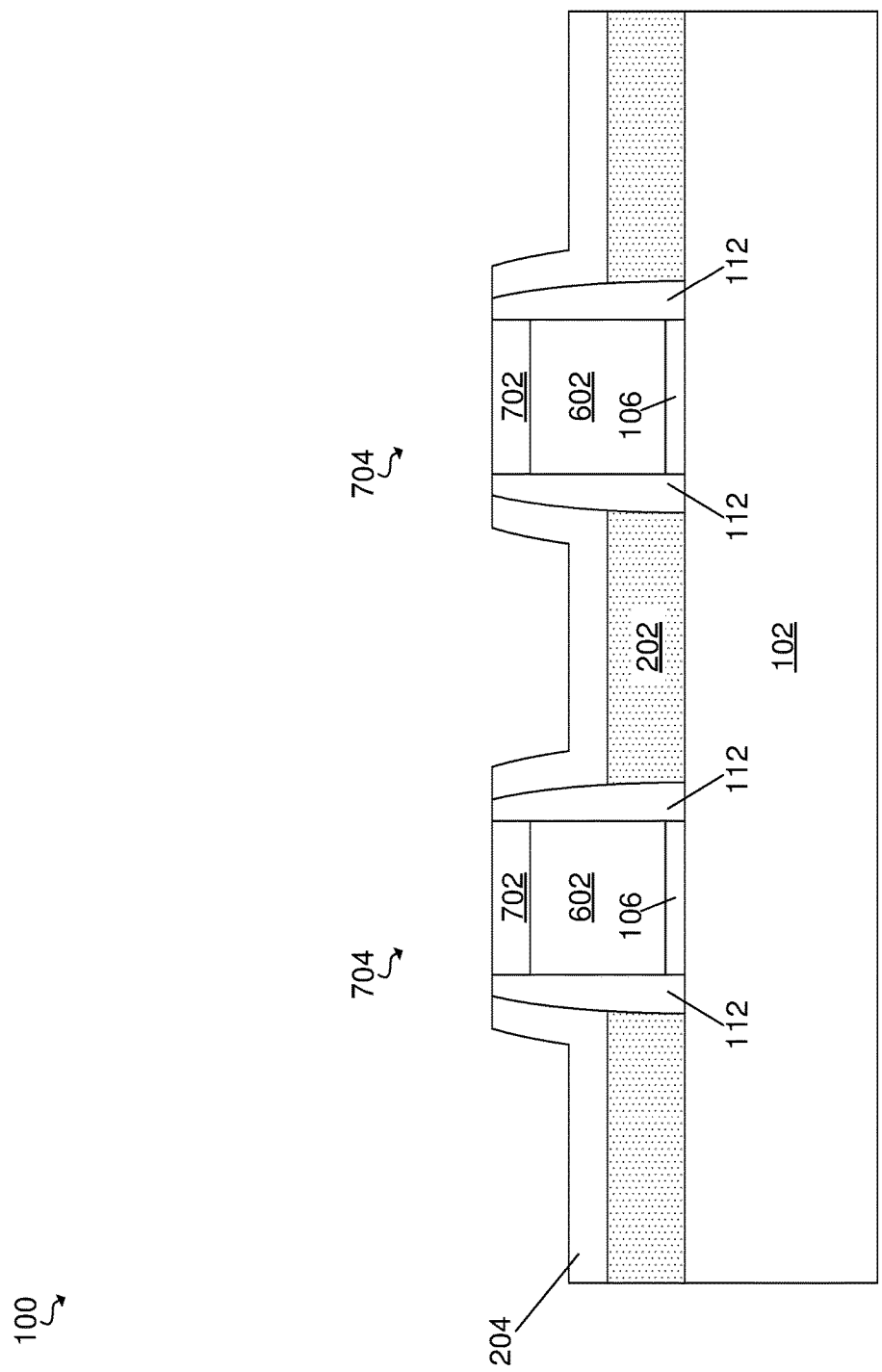
FIG. 8 is a cross section view illustrating removing the first dielectric layer, according to an embodiment of the present invention.

Referring now to FIG. 8, a cross section view illustrating removing the first dielectric layer 302 (FIG. 7) to expose the liner layer 204 is shown. The first dielectric layer 302 may be removed by an etching process that is selective to the gate cap 702, the gate spacers 112, and the liner layer 204, such as, for example, RIE or a stripping process. In an embodiment, an oxide deglaze using, for example, HF, may be used to remove the first dielectric layer 302.

Figure 9:
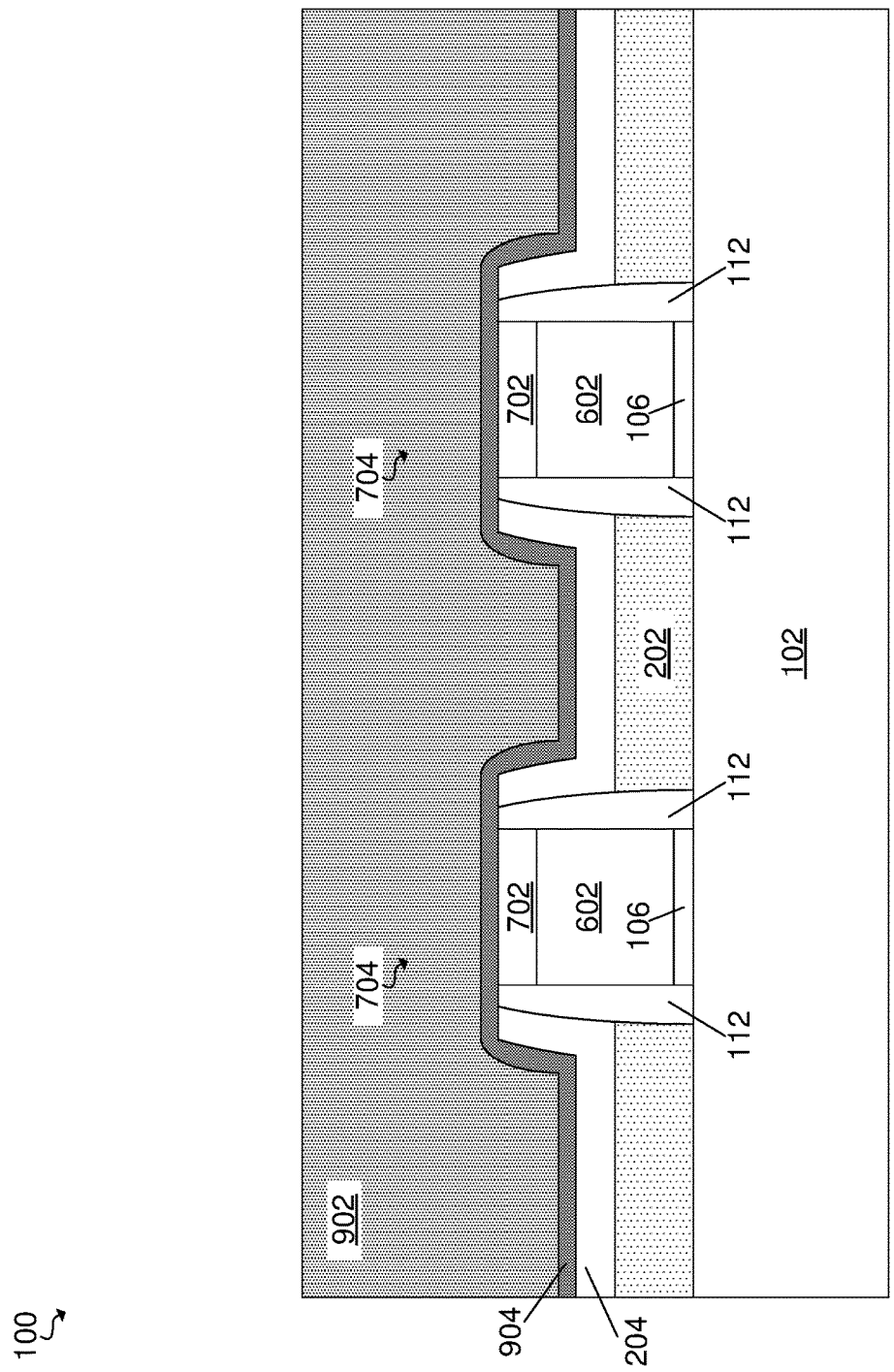
FIG. 9 is a cross section view illustrating forming an etch stop layer and a second dielectric layer, according to an embodiment of the present invention.

Referring now to FIG. 9, a cross section view illustrating forming a second dielectric layer 902 is shown. The second dielectric layer 902 may be composed of a dielectric material, such as, for example, an oxide, a nitride, or an oxynitride. The second dielectric layer 902 may be formed using a conventional deposition technique, such as, for example, CVD, PECVD, MOCVD, ALD, MLD, evaporation, reactive sputtering, chemical solution deposition, spin-on deposition, or other like processes. In an embodiment, an etch stop layer 904 may be formed on the liner layer 204, the gate spacers 112, and the gate cap 702 before the second dielectric layer 902 is formed. The etch stop layer 904 may be composed of an insulator, such as, for example hafnium oxide. The etch stop layer 904 may be formed using a conventional deposition technique, such as, for example, the methods described above. Although the etch stop layer 904 is shown in FIGS. 9-13, embodiments are considered in which the second dielectric layer 902 is formed directly on the liner layer 204.

Figure 10:
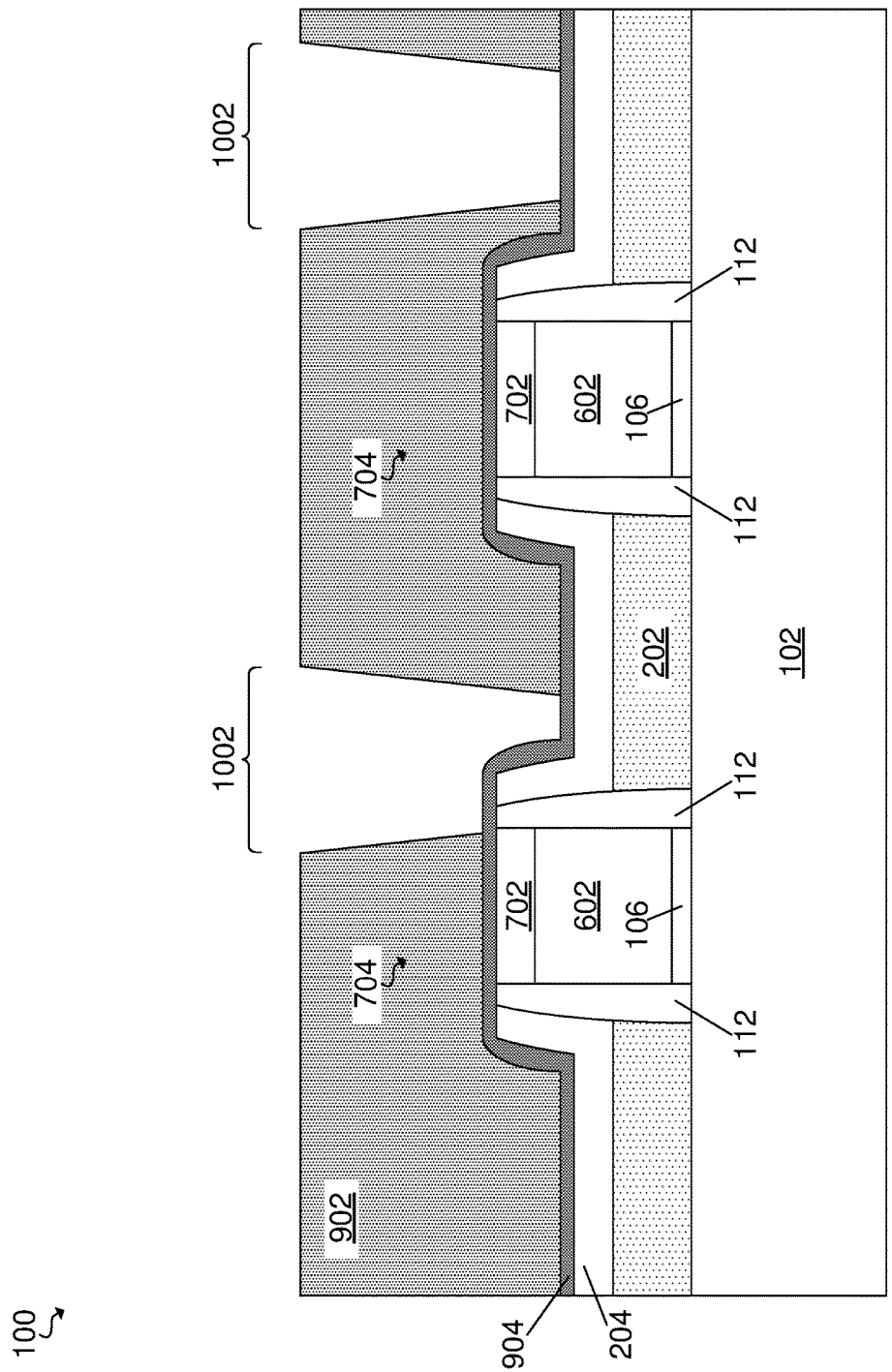
FIG. 10 is a cross section view illustrating forming contact trenches in the second dielectric layer, according to an embodiment of the present invention.

Referring now to FIG. 10, a cross section view illustrating forming one or more contact trenches 1002 (hereinafter "contact trenches") in the second dielectric layer 902 is shown. The contact trenches 1002 may be formed by removing a portion of the second dielectric layer 902 selective to the etch stop layer 904. The contact trenches 1002 may extend from an upper surface of the second dielectric layer 902 to the etch stop layer 904. The contact trenches 1002 may be preferably formed entirely over the S-D regions 202. However, embodiments of the present invention may allow for a portion of the contact trenches 1002 to extend over the gate stacks 704 without losing any contact area due to the formation of undercut regions 1202 (FIG. 12) described below. In an embodiment, the contact trenches 1002 may be formed using a selective etching process, such as, for example RIE.

Figure 11:
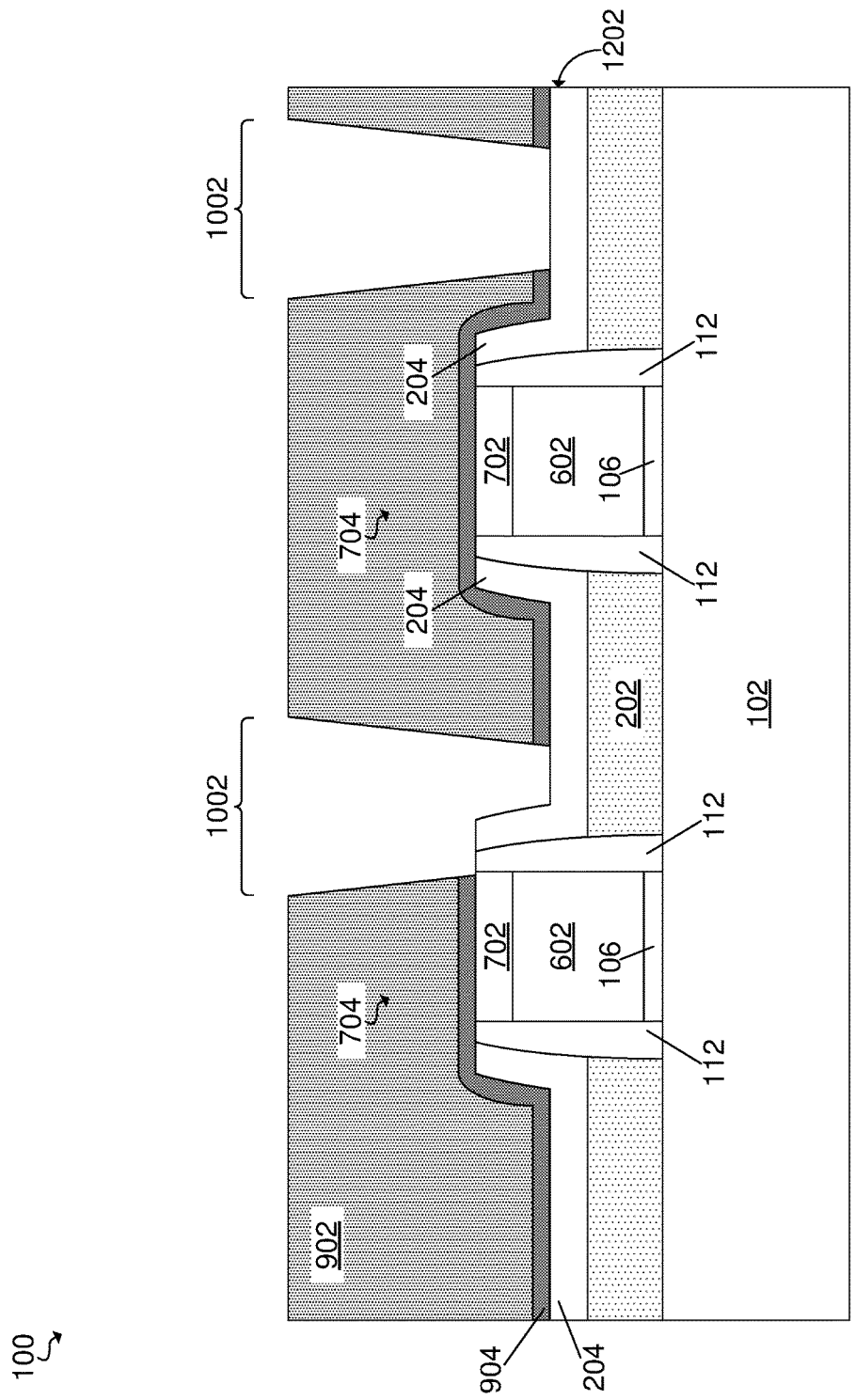
FIG. 11 is a cross section view illustrating removing portions of the etch stop layer exposed by the contact trenches, according to an embodiment of the present invention.

Referring now to FIG. 11, a cross section view illustrating removing portions of the etch stop layer 904 exposed by the contact trenches 1002 is shown. The portions of the etch stop layer 904 may be removed selective to the second dielectric layer 902, the gate cap 702, and the gate spacers 112. In an embodiment, the etch stop layer 904 may have a different etch rate than the liner layer 204, such that the portions of the etch stop layer 904 exposed by the contact trenches 1002 may be removed selective to the liner layer 204. The portions of the etch stop layer 904 exposed by the contact trenches 1002 may be removed using an anisotropic, or directional, etching process.

Figure 12:
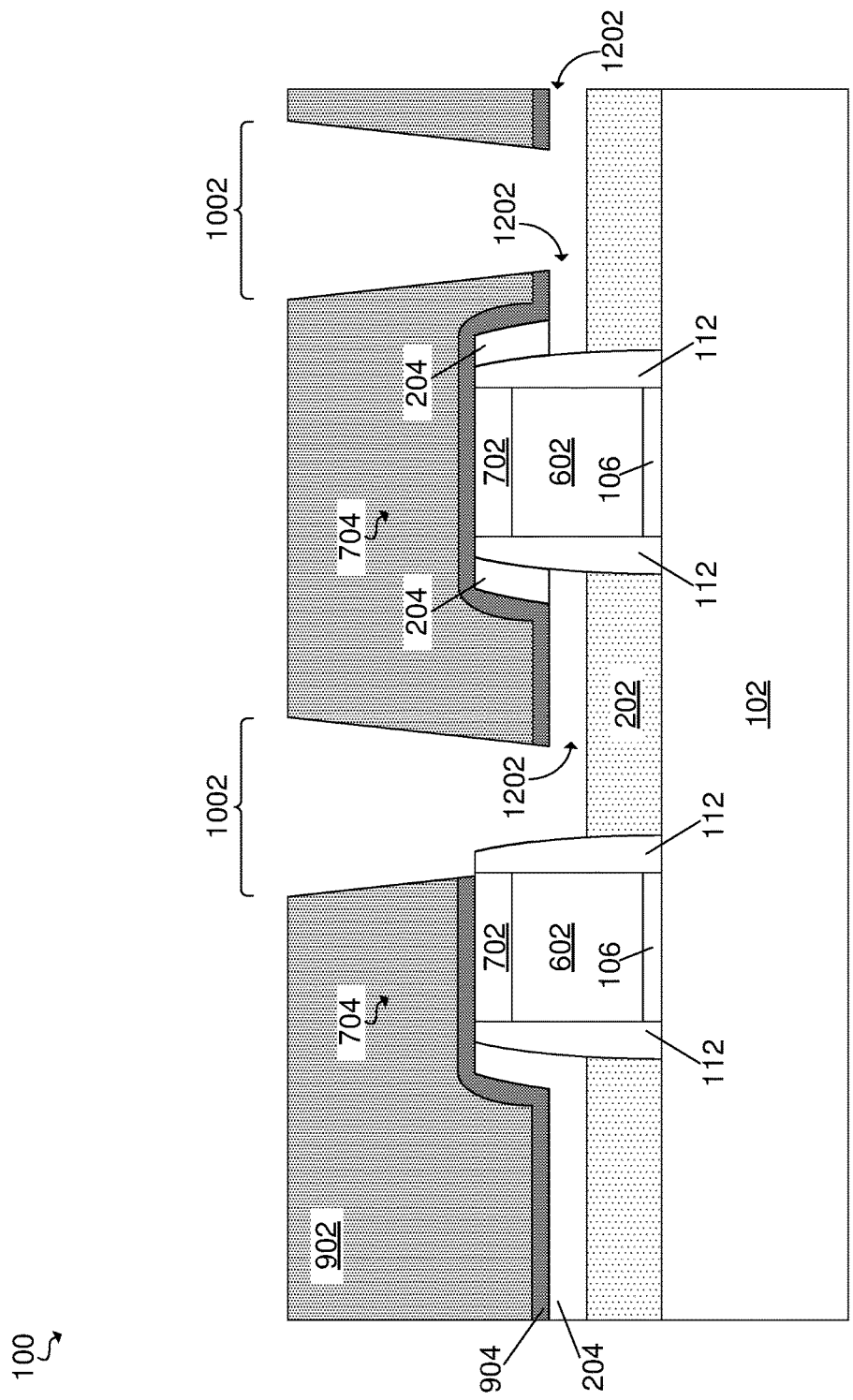
FIG. 12 is a cross section view illustrating removing portions of the liner layer to form undercut regions, according to an embodiment of the present invention.

Referring now to FIG. 12, a cross section view illustrating removing portions of the liner layer 204 to form one or more undercut regions 1202 (hereinafter "undercut regions") is shown. The portions of the liner layer 204 may be removed selective to the second dielectric layer 902, the gate cap 702, the etch stop layer 904, and the gate spacers 112. The portions of the liner layer 204 may be removed using an isotropic, or non-directional, wet etching process. In an embodiment, portions of the liner layer 204 below the contact trenches 1002 as well as below the second dielectric layer 902 may be removed to form the undercut regions 1202. A portion of the liner layer 204 may remain on an upper portion of the gate spacers 112.

In an embodiment, a portion of the etch stop layer 904 may remain below the second dielectric layer 902 and above the undercut regions 1202. The undercut regions 1202 may be defined by the S-D regions 202 on the bottom, the remaining portions of the liner layer 204 and the etch stop layer 904 on the top, the gate spacer 112 on a first side, and the contact trench 1002 on a second side. In an embodiment, the undercut regions 1202 may have a width that extends from the bottom of the contact trenches 1002 to the gate spacers 112.

Figure 13:
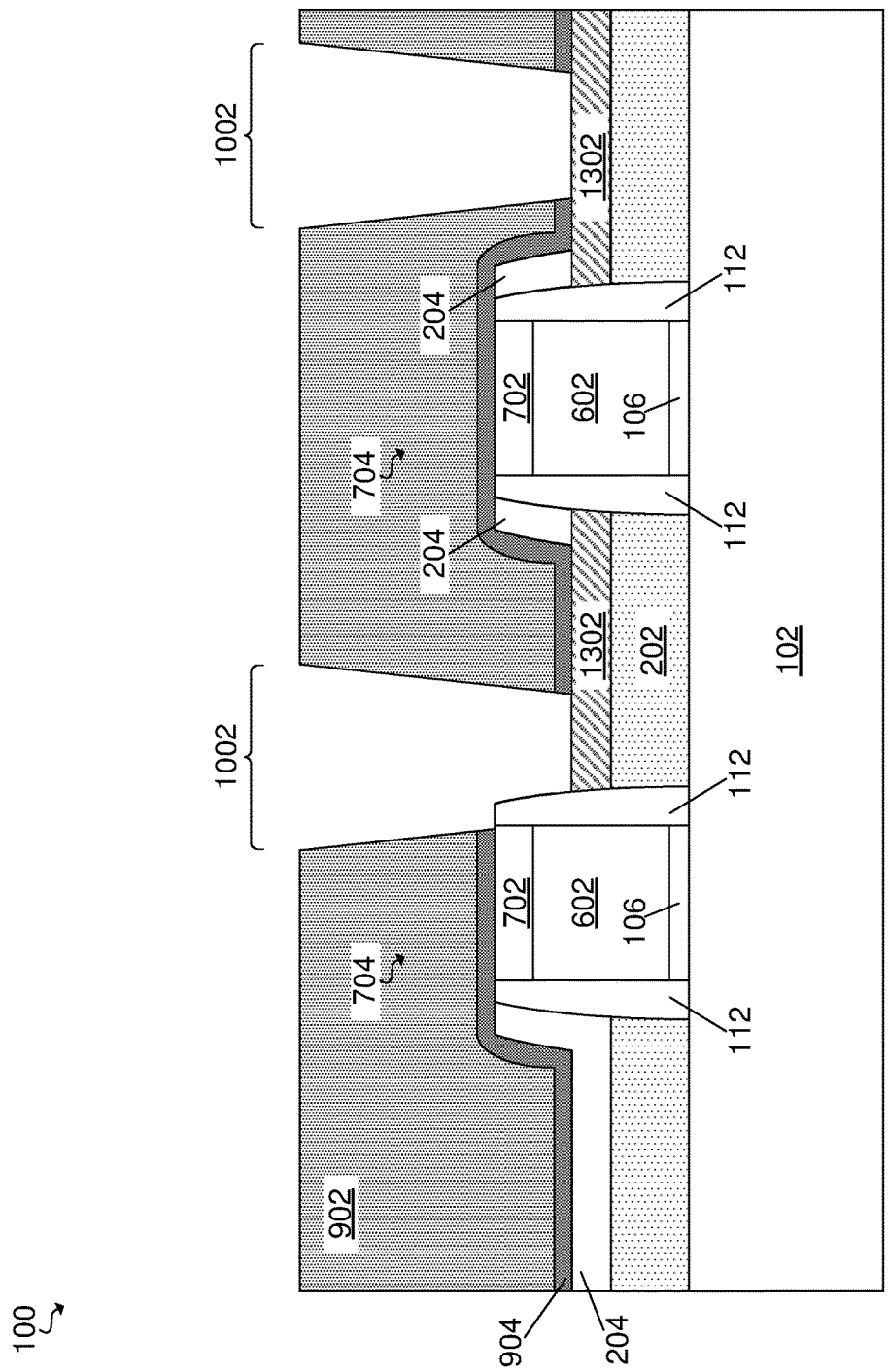
FIG. 13 is a cross section view illustrating forming silicides on the source-drain regions and in the undercut regions, according to an embodiment of the present invention.

Referring now to FIG. 13, a cross section view illustrating forming one or more contact silicide extensions 1302 (hereinafter "silicides") on the S-D regions 202 and in the undercut regions 1202 (FIG. 12) is shown. The silicides 1302 may be formed by depositing a refractory metal, such as, for example, nickel, platinum, titanium, cobalt, tantalum, or alloys thereof, onto the surface of the S-D regions 202 below the contact trenches 1002 and the undercut regions 1202. The refractory metal may be deposited using a conventional deposition technique, such as, for example, CVD, PECVD, MOCVD, ALD, MLD, evaporation, reactive sputtering, chemical solution deposition, spin-on deposition, or other like processes. Following deposition, the structure may then be subjected to an annealing step, including, but not limited to, rapid thermal annealing. During the annealing step, the deposited metal may react with silicon in the S-D regions 202 to form a metal silicide.

Because more surface area of the S-D regions 202 may be exposed by the undercut regions 1202 (FIG. 12), the silicides 1302 may extend beyond a width of the contact trenches 1002. In an embodiment, the silicides 1302 may have a contact area with the S-D regions 202 that is approximately five times greater than that of conventional contact silicides that suffer from misalignment, thereby greatly decreasing contact resistance. In another embodiment, the silicides 1302 may be in direct contact with an entire width of the S-D regions 202. In yet another embodiment, the silicides 1302 may extend from the gate spacer 112 of one gate stack 704 to the gate spacer 112 of an adjacent gate stack 704.

Figure 14:
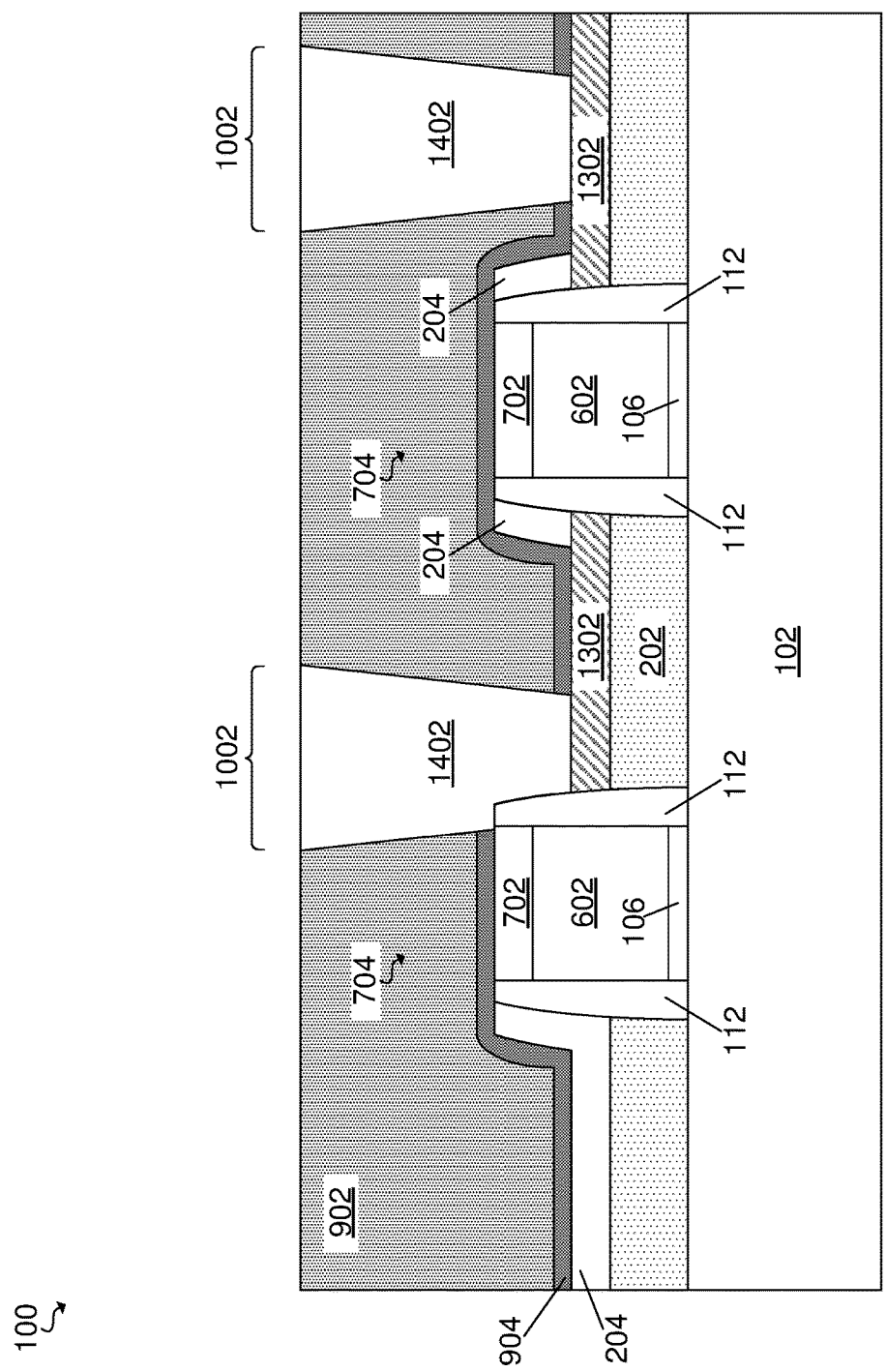
FIG. 14 is a cross section view illustrating forming contacts in the contact trenches, according to an embodiment of the present invention.

Referring now to FIG. 14, a cross section view illustrating forming one more electrical contacts 1402 (hereinafter "contacts") in the contact trenches 1002. The contacts 1402 may be formed by filling the contact trenches 1002 with a conductive material, such as, for example: tungsten, copper, aluminum, silver, gold, or alloys thereof. The contacts 1402 may be formed using a conventional deposition process, such as, for example, CVD, PECVD, MOCVD, ALD, MLD, evaporation, reactive sputtering, chemical solution deposition, spin-on deposition, or other like processes. The contacts 1402 may be formed on the silicides 1302. After deposition, a planarization process such as chemical-mechanical planarization (CMP) may be performed to remove any contact material above the contact via. In an embodiment, a liner material such as, for example, titanium nitride (TiN), tantalum nitride (TaN), or ruthenium (Ru) may be first deposited on the walls of the contact trenches 1002 before the contacts 1402 are formed.

Embodiments of the present invention may allow an increased contact area between electrical contacts and S-D regions in FET devices, which may greatly reduce contact resistance between the electrical contacts and the S-D regions. This may be especially advantages as device size continues to scale down, and gate pitch continues to decrease. By depositing a sacrificial liner layer below a dielectric layer in which contact trenches may be formed, and removing that liner layer using a selective removal process, undercut regions may be formed above the S-D region and adjacent to bottoms of the contact trenches. These undercut regions may then be filled with a material to form silicide extensions adjacent to the contact trenches that greatly enlarge the contact area with the S-D regions beyond a width of the contact trenches.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure comprising:
   a gate stack on a substrate;
   a gate spacer adjacent to and contacting a sidewall of the gate stack;
   a contact silicide above and in direct contact with a source drain region, both the contact silicide and the source drain region contact a sidewall of the gate spacer;
   a liner layer on the contact silicide and in direct contact with the sidewall of the gate spacer;
   an etch stop layer between the liner layer and a dielectric layer, wherein the etch stop layer is in direct contact with an uppermost surface of the gate stack and separated from the sidewall of the gate spacer by the liner layer; and
   a source drain contact above and in direct contact with the contact silicide, wherein a lateral width of the contact silicide is wider than a bottom surface of the source drain contact.

2. The semiconductor structure of claim 1, wherein an uppermost surface of the liner layer is substantially flush with an uppermost surface of the gate stack.

3. The semiconductor structure of claim 1, wherein the source drain contact is self-aligned to the gate stack and the gate spacer such that the source drain contact is in direct contact with an upper surface of the gate stack and the gate spacer.

4. The semiconductor structure of claim 1, wherein the liner layer comprises a metal nitride and is removable selective to the pair of gate spacers.

5. A semiconductor structure comprising:
   a gate stack on a substrate;
   a pair of gate spacers along opposite sidewalls of the gate stack;
   source drain regions above the substrate and adjacent to each of the pair of gate spacers;
   a contact silicide above and in direct contact with the source drain regions;
   a liner layer above the source drain regions;
   a source drain contact above and in direct contact with the contact silicide, wherein a lateral width of the contact silicide is wider than a bottom surface of the source drain contact; and
   an etch stop layer between the liner layer and a dielectric layer, wherein the etch stop layer is in direct contact with an uppermost surface of the gate stack and separated from sidewalls of the pair of gate spacers by the liner layer.

6. The semiconductor structure of claim 5, wherein a portion of the liner layer is surrounded by the etch stop layer, the contact silicide and one of the pair of gate spacers such that the etch stop layer is in direct contact with a side and a top of the portion of the liner layer.

7. The semiconductor structure of claim 5, wherein an uppermost surface of the liner layer is substantially flush with an uppermost surface of the gate stack.

8. The semiconductor structure of claim 5, wherein the source drain contact is self-aligned to the gate stack and one of the pair of gate spacers such that the source drain contact is in direct contact with the one of the pair of gate spacers.

9. The semiconductor structure of claim 5, wherein the liner layer comprises a metal nitride and is removable selective to the pair of gate spacers.

10. A semiconductor structure comprising:
    two or more gate stacks on a substrate;
    a pair of gate spacers along opposite sidewalls of each of the gate stacks;
    source drain regions above the substrate and adjacent to each of the pair of gate spacers;
    a contact silicide above and in direct contact with an entire top surface of at least one of the source drain regions, wherein the contact silicide extends from one gate spacer of one gate stack to another gate spacer of the other gate stack;
    a liner layer above the source drain regions; and
    a source drain contact above and in direct contact with the contact silicide.

11. The semiconductor structure of claim 10, further comprising:
    an etch stop layer between the liner layer and a dielectric layer.

12. The semiconductor structure of claim 11, wherein a portion of the liner layer is surrounded by the etch stop layer, the contact silicide and one of the pair of gate spacers such that the etch stop layer is in direct contact with a side and a top of the portion of the liner layer.

13. The semiconductor structure of claim 11, wherein the etch stop layer is in direct contact with an uppermost surface of the two or more gate stacks and separated from sidewalls of the pair of gate spacers by the liner layer.

14. The semiconductor structure of claim 10, wherein an uppermost surface of the liner layer is substantially flush with an uppermost surface of the two or more gate stacks.

15. The semiconductor structure of claim 10, wherein the source drain contact is self-aligned to the two or more gate stacks and the pair of gate spacers such that the source drain contact is in direct contact with one of the pair of gate spacers.

16. The semiconductor structure of claim 10, wherein the liner layer comprises a metal nitride and is removable selective to the pair of gate spacers.

* * * * *